United States Patent
Allen et al.

(10) Patent No.: US 6,515,066 B2
(45) Date of Patent: Feb. 4, 2003

(54) CASTING MIXTURES COMPRISING GRANULAR AND DISPERSION FLUOROPOLYMERS

(75) Inventors: David A. Allen, Brooklyn, CT (US); Brett W. Kilhenny, Mansfield Center, CT (US); Allen F. Horn, III, Danielson, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 09/797,438

(22) Filed: Mar. 1, 2001

(65) Prior Publication Data

US 2001/0053408 A1 Dec. 20, 2001

Related U.S. Application Data

(62) Division of application No. 09/023,273, filed on Feb. 13, 1998, now Pat. No. 6,218,015.

(51) Int. Cl.[7] .................................................. C08K 3/00
(52) U.S. Cl. ...................... 524/520; 524/492; 524/494; 524/495
(58) Field of Search ................................. 524/520, 492, 524/495, 494

(56) References Cited

U.S. PATENT DOCUMENTS

| | | | | |
|---|---|---|---|---|
| 4,451,616 A | * | 5/1984 | Kawachi | 525/178 |
| 4,849,284 A | | 7/1989 | Arthur et al. | |
| 5,216,068 A | * | 6/1993 | Zipplies | 524/546 |
| 5,312,576 A | | 5/1994 | Swei et al. | |
| 5,321,059 A | * | 6/1994 | Honda | 523/212 |
| 5,349,003 A | * | 9/1994 | Kato | 524/458 |
| 5,506,049 A | | 4/1996 | Swei et al. | |
| 5,571,609 A | | 11/1996 | St. Lawrence et al. | |
| 5,576,381 A | * | 11/1996 | Bladel | 524/544 |
| 5,846,447 A | * | 12/1998 | Beatty | 252/58 |
| 6,228,932 B1 | * | 5/2001 | Saito | 524/502 |

FOREIGN PATENT DOCUMENTS

| | | |
|---|---|---|
| EP | 0 391 568 A | 10/1990 |
| WO | WO/9736952 | 10/1997 |
| WO | WO 97/36954 | 10/1997 |

* cited by examiner

Primary Examiner—Edward J. Cain
(74) Attorney, Agent, or Firm—Cantor Colburn LLP

(57) ABSTRACT

An electrical circuit board fluoropolymer substrate and method of manufacture thereof, comprising a fluoropolymer matrix that includes a mixture of a granular first fluoropolymer resin and a dispersion second fluoropolymer resin. Preferably, the first and second fluoropolymer is polytetrafluoroethylene (PTFE). This mixture is suitable for forming unfilled or filled casting compositions to form thick films, or for dip-coating glass webs.

17 Claims, 1 Drawing Sheet

CASTING MIXTURES COMPRISING GRANULAR AND DISPERSION FLUOROPOLYMERS

CROSS REFERENCE TO RELATED APPLICATION

This application is a divisional of U.S. application Ser. No. 09/023,273, filed Feb. 13, 1998, now U.S. Pat. No. 6,218,015, which is incorporated by reference herein.

BACKGROUND OF THE INVENTION

1. Field of the Invention

The present invention relates to particulate-filled polymer matrix composite materials for circuit boards and methods of manufacturing the same. More particularly, this invention relates to filled fluoropolymer matrix composite films for circuit board substrates suitable for casting as thick films without cracking.

2. Brief Description of the Related Art

Electrical circuit boards generally comprise a conductive layer adhered to a dielectric substrate layer. The conductive layer is generally a metal such as copper, and the substrate layer is a dielectric polymer or polymer composite. Depending on the application for the circuit board, many different polymers, including phenolics, polyesters, epoxies, polyimides, and fluoropolymers are used. For high frequency electronic applications, such as radar, satellite communications, and cellular telephone systems, fluoropolymers such as poly(tetrafluoroethylene) (PTFE) are often the preferred matrix polymer due to their unique combination of excellent electrical properties and chemical resistance, as well as high temperature resistance. However, due to their high coefficient of thermal expansion relative to that of the conductive cladding, pure fluoropolymers are rarely used as a circuit substrate without combination with woven or random glass reinforcement, or particulate filler.

Woven glass-reinforced fluoropolymer matrix composites are generally made by a dip coating process, that is, by dip coating the woven glass material in an aqueous fluoropolymer dispersion. One drawback of the standard dip coating process is that multiple passes are required to achieve fluoropolymer contents of greater than about 25 weight percent in the final composite. Attempts to make higher fluoropolymer content composites in a single pass on a dip coating line result in severe cracking of the fluoropolymer coating upon drying.

Random glass-reinforced or particulate-filled fluoropolymer matrix composite films suitable for use as circuit board substrates are generally made by known paper-making, skiving, casting, melt extrusion, or "paste extrusion and calendering" processes. Fluoropolymer films produced by paper-making processes require random fiber reinforcement and are limited to thicknesses greater than about 2 mil.

Melt extrusion would be a preferred method for making particulate filled composites, but PTFE can not be melt extruded due to its extraordinarily high melt viscosity. The high melt viscosity of other neat fluoropolymers also complicates the production of fluoropolymer films by melt extrusion. Certain fluorocopolymers are known which provide lower melting temperature and lower melt viscosity at extrusion temperatures, for example, copolymers of tetrafluoroethylene with hexafluoropropylene (FEP) or with ethylene. The introduction of fillers further complicates the melt extrusion of fluoropolymers. In the presence of certain fillers, especially at high filler loading level, the melt processability of the melt extrudable fluoropolymers is rapidly degraded due to the increase in melt viscosity associated with the presence of the filler, or due to filler-catalyzed thermal degradation of the polymer matrix.

Accordingly, paste extrusion and calendering is a preferred method of making particulate-filled fluoropolymer films for circuit board substrates. A method of making highly filled PTFE composite materials which exhibit excellent physical and electrical properties by paste extrusion and calendering is set forth in commonly assigned U.S. Pat. No. 4,849,284 to Arthur et al., the disclosure of which is incorporated herein by reference in its entirety. Another preferred method of making a filled fluoropolymer circuit substrate is by casting from aqueous dispersion. This method is particularly convenient and cost-effective for the manufacture of thin films of fluoropolymer is further described in commonly-assigned U.S. Pat. No. 5,312,576 to Swei et al., also incorporated herein by reference in its entirety.

The casting method of Swei et al. comprises adding particulate filler to aqueous PTFE dispersion, adding a surfactant to facilitate wetting of the filler particles, and a viscosifying agent to retard setting of the mixture, and then casting the mixture onto a carrier film. After casting, the films are baked to remove volatile materials, sintered, and removed from the casting substrate. The cast films have a variable thickness in the range from about 0.5 to 2.5 mil, and are intended for use as substrates for thin digital circuits. Thicker sheets (up to about 5 mils) may be cast by this method by the incorporation of a 40 foot, low temperature platen drier between the casting step and the baking and sintering oven.

Thus, while Swei et al. describes casting methods suitable for films having thicknesses in the range of about 0.5 to 5 mils, there remains a need for methods of forming thicker particulate-filled substrates in the range from about 10 to about 100 mils, particularly for use with microwave circuit boards. Manufacture of thick substrates currently requires lamination of a stack of multiple sheets, each sheet having a thickness of less than 6 mils, and each made by a single pass through the manufacturing line, which adds considerably to the expense of manufacture.

An additional problem associated with casting is that the carrier films onto which the dispersion is cast have a finite lifetime, degrading upon repeated exposure to high temperatures. A cast sheet achieving just twice the thickness of prior art sheets during a single pass would effectively halve the amortized cost of the carrier on a square foot per mil basis. Finally, attempts to cast fluoropolymer composite films having a lower filler content (less than about 40 volume percent) by the method of Swei et al. results in cracking of the film during drying under conventional conditions. Similar attempts to cast films having a thickness of at least about 6 mils of higher particulate content composites by the method of Swei et al. can result in cracking of the film during drying under conventional conditions. The resulting cracking is an impediment to the processing and use of thicker fluoropolymer composite sheets.

Accordingly, there remains a need in the art for a method and formula for forming fluoropolymer composite sheets having a thickness of at least about 10 mils, and which can be manufactured without cracking when the composite sheets are dried at an economical rate, i.e., at greater than 4 feet per minute (fpm). There is also a need in the art for fluoropolymer mixtures which will minimize the number of passes required to form thick layers on woven glass.

SUMMARY OF THE INVENTION

The above-described and other drawbacks and deficiencies of the prior art are alleviated by the fluoropolymer electrical circuit board substrate and method of manufacture of the present invention, wherein the substrate comprises a fluoropolymer matrix that includes a mixture of a granular first fluoropolymer and a dispersion second fluoropolymer. Preferably, the first and second fluoropolymer have the same chemical composition, being poly(tetrafluoroethylene) (PTFE). Importantly, however, the PTFE is made by different manufacturing methods that result in different particle size distributions, referred to herein as "granular" and "dispersion" forms. The different particle size distributions of the two components, which will be described in more detail below, apparently results in the unexpected and surprising improvements described herein. In particular, the addition of granular fluoropolymer powder with a median particle size of about 30–40 microns to a dispersion fluoropolymer allows the manufacture of considerably thicker sheets in a single pass than when the conventional casting process is practiced. The mixtures also provide an increase in the coating weight of fluoropolymer or filled fluoropolymer casting compositions on woven or non-woven glass substrates, thereby allowing casting of thicker films on a single pass, and thus more economical manufacture of thick PTFE composite substrates.

The fluoropolymer matrix mixture in accordance with the present invention is thus suitable for forming thick sheets from either filled or unfilled casting compositions, wherein the filled compositions comprise up to about 95% volume percent of filler particles distributed throughout the matrix. This mixture is also suitable for forming thick composite substrates comprising woven or non-woven glass. The above-discussed and other features and advantages of the present invention will be appreciated and understood by those skilled in the art from the following detailed description and drawings.

BRIEF DESCRIPTION OF THE DRAWINGS

For the purpose of illustrating the invention, there are shown in the drawing forms which are presently preferred; it being understood, however, that this invention is not limited to the precise arrangements and instrumentalities shown. Referring now to the drawings wherein like elements are numbered alike in the several FIGURES.

DETAILED DESCRIPTION OF THE INVENTION

Figure 1:
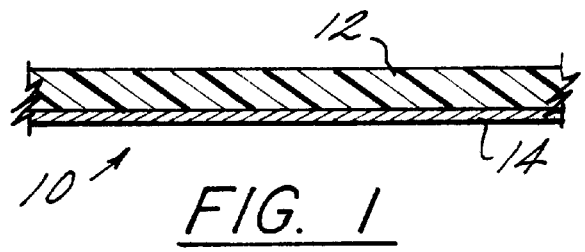
FIG. 1 is a single clad electrical circuit substrate in accordance with the present invention.

The electrical substrate composition of the present invention comprises a fluoropolymer matrix and a filler, wherein the fluoropolymer matrix is formed from a mixture of a granular first fluoropolymer and a dispersion second fluoropolymer. Preferably, the first and second fluoropolymer have the same chemical composition, being poly (tetrafluoroethylene) (PTFE). Importantly, however, the PTFE is made by different manufacturing methods that result in different particle size distributions, referred to herein as "granular" and "dispersion" forms, which will be defined with more specificity below. The different particle size distributions of the two components apparently results in the unexpected and surprising improvements described herein.

This composition allows the casting of particulate filled sheets of a thickness of up to about 10 mils without cracking when the mixture is cast and dried under conventional conditions. Such mixture also allows the formation of thick substrates in a minimal number of passes, including substrates having woven glass reinforcement. The mixture optionally further comprises at least one particulate filler, a surfactant, and a viscosity modifier. The composition also allows the casting of sheets having low quantities of filler, i.e., down to about 0 volume percent.

In accordance with the method of the present, a granular first fluoropolymer is added to a dispersion second fluoropolymer in a first carrier liquid to form a mixture. Preferably, the granular first fluoropolymer is present in an amount of between about 5 weight % and about 60 weight % of the resin mixture on a solids basis. The dispersion second fluoropolymer may already contain at least one of an optional particulate filler, an optional surfactant, and an optional viscosity modifier, or these components may be added after the addition of the granular first fluoropolymer to the solution or dispersion second fluoropolymer. Preferably, the particulate filler is added as a suspension or dispersion in a second carrier liquid. The final mixture, the "casting composition", is then cast and consolidated by methods known in the art.

Suitable first and second fluoropolymer compositions include those known in the art for circuit substrates, and include but are not limited to fluorinated homopolymers, for example polytetrafluoroethylene (PTFE), and fluorinated copolymers, e.g. copolymers of tetrafluoroethylene with hexafluoropropylene or perfluoroalkylvinylethers such as perfluorooctylvinyl ether, or copolymers of tetrafluoroethylene with ethylene. Blends of fluorinated polymers, copolymers, and terpolymers formed from the above listed monomers are also suitable for use with the present invention. Preferably, the first and second fluoropolymers have the same chemical compositon. A particularly preferred fluoropolymer is PTFE. It is to be recognized that the term the "same" chemical compositon as used herein includes compositions having minor variations in chemical composition, that is, where PTFE is used as the first and second fluoropolymer, they are referred to as having the same chemical composition even though there may there may be minor variations in chemical composition due, for example, to differences in their respective manufacturing processes.

As used herein, "granular" and "dispersion" are terms of art commonly used in connection with the various forms of fluoropolymers, and refers to the physical characteristics of the fluoropolymer, particularly particle size. Particle size in turn is determined by the method of fluoropolymer manufacture. Three general forms of fluoropolymer, in particular PTFE, resin are widely commercially available (Encyclopedia of Polymer Science and Engineering, H. F. Mark et al., Ed., Second Edition, Wiley-Interscience, pp. 755–648, New York (1989), the relevant portions of which are herein incorporated by reference).

"Dispersion PTFE" is generally sold as a dispersion (also called an "emulsion") of about 25 to 60 weight % PTFE in water, stabilized with a surfactant such as Triton X-100 (available from Rohm & Haas). According to DuPont's commercial literature, the PTFE particles are approximately 0.2 micron in diameter. Dispersion PTFE is made by a method known as "dispersion" (or "emulsion") polymerization, as defined by G. Odian, Principles of Polymerization, Second Edition, J. Wiley & Sons, New York, pp. 287–88 (1981), the relevant portions of which are incorporated herein by reference. Dispersion PTFE is most widely used for dip coating of woven glass. It is also used in the conventional casting method for the manufacture of unfilled thin PTFE sheet. The above-described novel casting method of U.S. Pat. No. 5,312,576 to Swei et al. also uses dispersion PTFE. Other fluoropolymers such as DuPont's Teflon FEP (poly(tetrafluoroethylene-co-hexafluoropropylene)) and Teflon PFA (poly (tetrafluoroethylene-co-perfluoroalkylvinylether)) are also available in dispersion with the same approximate particle size.

The second form of available fluoropolymer is "fine powder" (or "coagulated dispersion") PTFE. As implied by its alternative name, fine powder PTFE is made by coagulation and drying of dispersion-manufactured PTFE. According to DuPont's commercial literature, fine powder PTFE is generally manufactured to exhibit a particle size of approximately 400 to 500 microns. It is used in the manufacture of paste extruded articles, such as wire insulation and in paste extrusion and calendering.

The third form of available fluoropolymer is "granular" PTFE. Granular PTFE is made by a "suspension" polymerization method as described in the above-cited Mark and Odian references. Granular PTFE is generally used for compression molding of PTFE articles. It is also widely used for the molding of billets which are then skived on a lathe to produce PTFE sheet. Granular PTFE is generally manufactured in two different particle size ranges. The "standard" product is made with a median particle size of approximately 30–40 microns. The "high bulk density" product exhibits a median particle size of about 400–500 microns. In addition to these forms of PTFE, other fluoropolymer compositions such as DuPont Teflon FEP and PFA are also available in "pellet" form. The pellets can be cryogenically ground to exhibit a median particle size of less than 100 microns. It is expected that such materials, with the appropriate particle size distribution would act to achieve the same end in the present invention as granular PTFE.

Accordingly, "granular" fluoropolymers as used herein may refer to fluoropolymers manufactured by either suspension polymerization or by cryogenic grinding of pellets to the granular form. The particle size of the granular first fluoropolymer in accordance with the present invention is in the range from about 5 $\mu$m to about 75 $\mu$m. Particularly preferred for use in the present invention is a granular PTFE commercially available under the trade name Teflon 7A, available from DuPont, Wilmington, Del. having a particle size on the order of 35 microns.

The second fluoropolymer is in the form of a dispersion in a first carrier liquid. The choice of carrier liquid for the second fluoropolymer is based on the identity of the particular fluoropolymer, i.e., a suitable carrier liquid is one in which the second fluoropolymer is not soluble. Water is a suitable carrier liquid for a dispersion PTFE particles. Preferably, the second fluoropolymer is an aqueous PTFE dispersion. Dispersions PTFE solids typically contain solids having a small particle size, on the order of 0.2 microns. A suitable dispersion PTFE in water is available under the trade name Teflon TE 30, which is commercially available from DuPont, Wilmington, Del. Another dispersion PTFE in water known as D60A from Ausimont has also been found to be particularly suitable for use in the practice of the present invention.

The mixture of granular first fluoropolymer and dispersion second fluoropolymer may be used directly as a casting composition to form unfilled films or to coat woven or non-woven glass webs to form fluoropolymer and woven or non-woven glass web composites. Alternatively, the mixture may comprise additional components, including particulate fillers, surfactants, and viscosity modifiers.

Preferred particulate filler materials for use with the present invention include organic or inorganic particulate materials known in the art. The terms "particulate" and "particles" as used herein are intended to include random fibers. Suitable inorganic filler materials include, but are not limited to, glass particles, ceramic particles, metallic particles, carbon particles and mineral particles. Specific examples of suitable particles include glass beads, glass microspheres, glass fibers, silica particles, random glass microfibers, carbon black, titanium dioxide particles and barium titanate particles. Glass particles and silica particles, particularly amorphous fused silica particles and silica particles made by a sol gel process, are preferred for applications requiring a low dielectric constant such as dielectric layers of laminar electrical circuits. Specific examples of suitable polymeric particulate fillers include rigid, high temperature polymeric materials that withstand processing temperatures of greater than about 350° C., including liquid crystalline polymers (LCP), polyetherimide (PEI), poly (ethersulfone), thermoplastic and thermoset polyimides, poly(ketone), poly(ether ether ketone) (PEEK), poly (phenylenesulfide), and polysulfone, as described in the commonly assigned patent application U.S. Ser. No. 08/795,857 to Horn et al.

The shape of the filler particles, the size of the filler particles, and the size distribution of the filler particles are important parameters with regard to the processing and final physical characteristics of the particle-filled composite article of the present invention. As used herein the "equivalent spherical diameter" of a filler particle is the diameter of a sphere which occupies the same volume as that occupied by the filler particle. In a particularly preferred embodiment of the present invention, the filler particles comprise spherical silica particles of a substantially uniform size, i.e. all particles are within plus or minus 10% of a nominal particle diameter. A fused amorphous silica commercially available under the trade name Minsil-20 by Minco Corp. has been found to be particularly suitable for use in the practice of the present invention.

The particulate filler material may be surface treated to form a hydrophobic coating thereon, in order to improve the moisture resistance and improve the mechanical properties of the composite film of the present invention. The hydrophobic coating may comprise any coating material known in the art that is thermally stable, exhibits low surface energy, and improves the moisture resistance of the composite of the present invention.

Suitable coating materials include conventional silane coatings, titanate coatings and zirconate coatings. Preferred silane coatings include phenyltrimethoxysilane, phenyltriethoxysilane, 3,3,3-trifluoropropyltrimethoxysilane, (tridecafluoro-1,1,2,2-tetrahydrodecyl)-1-triethoxysilane and mixtures thereof. Suitable titanate coatings include neopentyl(diallyl) oxytrineodecanoyl titanate, and neopentyl(diallyl)oxytri (dioctyl)phosphate titanate. Suitable zirconate coatings include neopentyl(diallyl)oxytri(dioctyl)pyrophosphate zirconate and neopentyl(diallyl)oxytri(N-ethylenediamino) ethyl zirconate.

The hydrophobic coating is used in an amount effective to render the surfaces of the filler particles hydrophobic and compatible with the matrix material. The amount of coating relative to the amount of inorganic particles coated will vary with the surface area coated and density of the inorganic particles. Preferably, the coated inorganic particles of the present invention include from about 0.5 parts by weight (pbw) hydrophobic coating to about 100 pbw inorganic particles to about 25 pbw hydrophobic coating to about 100 pbw inorganic particles.

The optional particulate filler of the present invention is preferably added to the fluoropolymer mixture in the form of a suspension in a suitable second carrier liquid, i.e., a liquid in which the filler is not soluble. The second carrier liquid is the same, or may different than the first carrier liquid, as long as it is miscible with the first carrier liquid. For example, if the first carrier liquid is water, the second carrier liquid may comprise water or an alcohol. Preferably, the second carrier liquid is water.

Preferably, the casting composition comprises from about 10 vol. % to about 60 vol. % of solids, that is, the combined polymeric mixture and filler particles (if present), and from about 40 vol. % to about 90 vol. % of the combined first and second (if present) carrier liquids.

Regarding the solid components alone, where particulate filler is present, the combined first and second fluoropolymer comprises from about 5 vol. % to about 85 vol. % fluoropolymer mixture, and from about 15 vol. % to about 95 vol. % filler particles, and preferably from about 30 vol. % to about 70 vol. % fluoropolymer mixture, and from about 30 vol. % to about 70 vol. % filler particles. Most preferably, the combined first and second fluoropolymer comprises from about 35 vol. % to about 60 % fluoropolymer mixture and from about 40 vol. % to about 65 vol. % filler particles.

The casting composition in accordance with the present invention may also include an optional surfactant. The surfactant may be added at any point in mixing, but is preferably added to prior to the addition of the granular fluoropolymer and/or particulate filler. The surfactant is used in an amount effective to modify the surface tension of the solution so as to enable the filler particles to be wetted. Preferably, the surfactant is added to the dispersion of filler particles in the second carrier liquid. Such dispersion comprises from about 10 vol. % to about 50 vol. % filler particles, from about 0.1 vol. % to about 10 vol. % surfactant, with the remainder comprising the first carrier liquid. Suitable surfactant compounds include ionic surfactants and non-ionic surfactants. Triton X-100 (commercially available from Rohm & Haas) has been found to be a suitable surfactant for use in aqueous filler dispersions.

If necessary, the viscosity of the casting composition of the present invention is adjusted by the addition of suitable viscosity modifier effective to provide a casting composition having a viscosity compatible with a conventional casting equipment. The viscosity modifier retards separation, i.e. sedimentation or flotation, of the filler particles from the casting composition. It may be omitted if the viscosity of the casting composition is sufficient to provide a casting composition that does not separate during the time period of interest.

The viscosity modifier is chosen on the basis of its compatibility with a particular carrier liquid or mixture of carrier liquids. Conventional viscosity modifiers suitable for use in aqueous casting compositions include, but are not limited to, polyacrylic acid compounds, vegetable gums and cellulose-based compounds. Specific examples of suitable viscosity modifiers include polyacrylic acid, methyl cellulose, polyethyleneoxide, guar gum, locust bean gum, sodium carboxymethylcellulose, sodium alginate and gum tragacanth.

The above-described components may be combined in almost any order, but preferably the granular first fluoropolymer is mixed with the dispersion second fluoropolymer in the first carrier liquid and optional surfactant, followed by mixing with the suspension of particulate filler in the second carrier liquid and optional surfactant. The viscosity of the resulting solution is then adjusted to yield the casting composition.

The casting composition is then cast onto a casting substrate by conventional methods, for example by dip coating, reverse roll coating, knife-over-roll, knife-over-plate, and metering rod coating. Suitable substrate materials include, but are not limited to, metallic films, polymeric films or ceramic films. Specific examples of suitable casting substrates include stainless steel foil, polyimide films, polyester films, and fluoropolymer films.

The cast layer is then consolidated by the removal of the carrier liquid(s) and processing aids, i.e. the surfactant and viscosity modifier, by means known in the art such as evaporation, thermal decomposition, or a mixture thereof. Preferably, the film of the present invention is consolidated by heating. Additional heat treatment may be used to further modify the properties of the consolidated film.

The composition of the consolidated film corresponds to that of the combined amount of fluoropolymer material and filler particles set forth above in regard to the casting composition, i.e., where filler is used the film comprises from about 5 vol. % to about 85 vol. % fluoropolymer and from about 15 vol. % to about 95 vol. % filler particles. Preferably, the film comprises from about 30 vol. % to about 70 vol. % fluoropolymer and from about 30 vol. % to about 70 vol. % filler particles and most preferably comprises from about 35 vol. % to about 60 vol. % fluoropolymer and from about 40 vol. % to about 65 vol. % filler particles.

When used in conjunction with a glass web, the fluoropolymeric matrix may be filled or unfilled, and the glass web may be woven or non-woven. When unfilled, the consolidated substrate comprises from about 35 wt. % to about 95 wt. % fluoropolymer and from about 5 wt. % to about 65 wt. % glass. When filled, the consolidated substrate comprises from about 40 vol. % to about 95 vol. % combined fluoropolymer and particulate filler and from about 60 vol. % to about 5 vol. % glass. The relative proportions of fluoropolymer and particulate filler are the same as those mentioned above, i.e., the combined fluoropolymer and particulate filler comprises from about 5 vol. % to about 85 vol. % fluoropolymer and from about 15 vol. % to about 95 vol. % filler particles, preferably from about 30 vol. % to about 70 vol. % fluoropolymer and from about 30 vol. % to about 70 vol. % filler particles, and most preferably comprises from about 35 vol. % to about 60 vol. % fluoropolymer and from about 40 vol. % to about 65 vol. % filler particles.

The casting substrate and consolidated film may be used in combination as a laminar composite material or as a casting substrate for subsequent cast and consolidated layers. Alternatively, the casting substrate may be removed from the film. The substrate may be destructively removed, for example by dissolution in a solvent, chemical reaction, or thermal degradation, or the substrate may be reuseably removed, for example by overcoming interfacial adhesion between the cast film and substrate. After removal, the consolidated film may be used alone, or it may be used as a substrate for subsequent casting of further layers in order to build up a thicker, multilayer film.

Referring now to FIG. 1, a filled fluoropolymeric composite substrate for an electrical circuit board in accordance with the present invention is shown in the form of a circuit board 10, wherein the composite 12 comprises a dielectric sheet clad on one side with a conductive sheet 14, which is preferably a metal sheet such as copper or aluminum. The fluoropolymer composition optionally comprise a filler (not shown) as described herein.

Figure 2:
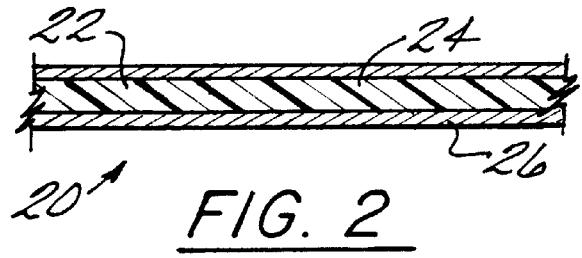
FIG. 2 is a diclad electrical circuit substrate in accordance with the present invention.

Referring to FIG. 2, a diclad filled fluoropolymeric composite substrate in accordance with the present invention is shown in the form of a circuit board 20, wherein the composite 22 comprises a dielectric sheet clad between conductive sheets 24, 26, which are preferably metal sheets such as copper or aluminum. The fluoropolymer composition optionally comprises a filler (not shown) as described herein.

Figure 3:
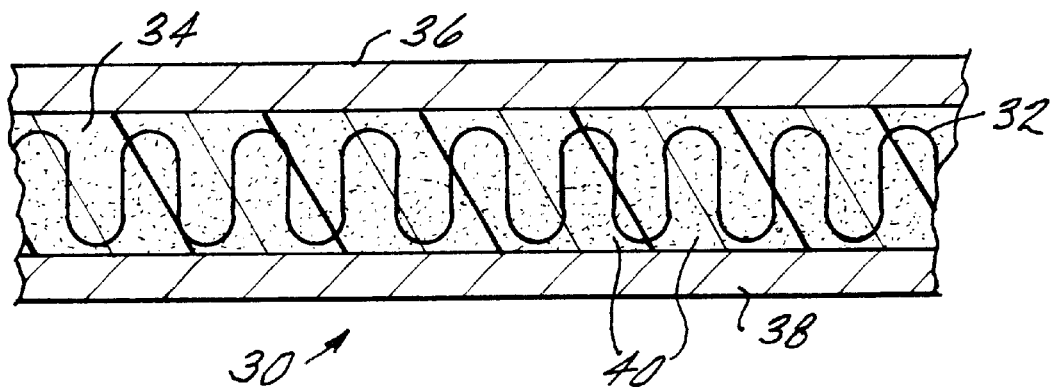
FIG. 3 is an electrical circuit substrate comprising a woven or non-woven glass web in accordance with the present invention.

Referring to FIG. 3, a fluoropolymeric composite substrate in accordance with the present invention is shown in the form of a circuit board 30, comprising a glass web 32 impregnated with fluoropolymer composition 34 between conductive sheets 36, 38, which are preferably metal sheets such as copper or aluminum. The fluoropolymer composition 34 may optionally comprise a filler 40 as described herein.

The invention is further described by way of the following non-limiting examples.

EXAMPLES

Chemicals, sources, and descriptions are listed in the Table below:

| Trade Name | Source | Description |
| --- | --- | --- |
| D60A | Ausimont | PTFE dispersion in water |
| Minsil-20 | Minco Corp. | Fused amorphous silica |
| DC-6124 | Dow Corning | Silane |
| ASE-75 | Rohm & Haas | Acrylic acid dispersion in water |
| Teflon 7A | DuPont | Granular PTFE |
| Triton X-100 | Rohm & Haas | Surfactant |
| Tionia VC | SCM Chemical Corp. | Titania, $TiO_3$ |
| 1080 | Clark-Schwebel | Woven glass |

Comparative Example 1

As taught by U.S. Pat. No. 5,312,576 to Swei et al., 310.15 kg of D60A PTFE dispersion (60 wt. % PTFE solids) was placed in a mixing vessel and agitated with a propeller mixer. 82.83 kg of Minsil-20 was added, along with 1.12 kg of DC-6124, 54 g of formic acid and 1729 g of ASE-75 acrylic acid dispersion. The formic acid is added to ensure that the pH of the slurry is less than about 6.5, in order to prevent dissolution of the ASE-75 thickener during mixing. The slurry was allowed to mix and 366 g of ammonium hydroxide solution was added to increase the pH to a value of about 8.9 in order to solubilize the ASE-75. The total solids content of this mixture was calculated to be 50.2 vol. percent. The silica filler content of this mixture was 21 vol. percent on a dry solids basis.

The mixture was then cast under standard conditions with a line speed of 10 fpm, resulting in severe cracking. The drying temperatures were reduced and the line speed was reduced to as low as 4 fpm without alleviating the cracking. No combination of line speed and low temperatures were found that allowed this mixture to cast into 0.005" sheet without severe cracking.

Example 2

To 8100 g of the above mixture 630 g of Teflon 7A granular resin and 270 g of Minsil-20 were added, which increased the solids content to about 52.7 vol. %. The silica content of this modified mixture was also 21 vol. % of a dry solids basis. The mixture was cast on the same casting line at standard line conditions at a line speed of 10 fpm. A thick sheet of 0.005" was produced, which was free of large cracks. Visual drying was achieved at 31 linear feet in the platen dryer, indicating that a high line speed would also work.

Comparative Example 3

A casting composition was formulated by the procedure outlined in Example 1 according to U.S. Pat. No. 5,312,576 to Swei et al., comprising D60A dispersion PTFE, Minsil-20 silica, and Tionia VC titania. The total solids content of the casting composition was 42.1 wt. % PTFE, 54.1 wt. % silica, and 3.8 wt. % titania, on a dry solids basis. The casting composition contained a total of 70 wt. % dry solids (51.2 vol. %). Attempts to cast these mixes into 0.010" width sheets on a laboratory coating unit, followed by drying under ambient room conditions resulted in severe cracking.

Comparative Example 4

A casting composition was formulated by the procedure outlined in Example 1 according to U.S. Pat. No. 5,312,576 to Swei et al,. comprising D60A dispersion PTFE, Minsil-20 silica, and Tionia VC titania. The total solids content of the casting composition was 42.1 wt. % PTFE, 54.1 wt. % silica, and 3.8 wt. % titania, on a dry solids basis. The casting composition contained a total of 73 wt. % solids (54.9% vol. percent). Attempts to cast these mixes into 0.010" width sheets on a laboratory coating unit followed by drying under ambient room conditions resulted in severe cracking.

Example 5

8275 g of D60A PTFE dispersion was mixed in a 5 gallon bucket. 1840.7 g of water, 134.8 g of Triton X-100, 10 g of formic acid, 946 g of Teflon 7A granular PTFE, 7598.9 g of Minsil-20, 116 g of DC-6124 and 530.3 g of Tionia VC were added to the PTFE dispersion and mixed. 80 g of ASE-75 was then added and the pH of the mix was adjusted to 9.5 with ammonium hydroxide to solubilize the viscosifier. The casting composition thus obtained contained a total of 72.65 wt. % solids (54.5 vol. %). This mix was cast into a 0.010" thick sheet by a laboratory coater and dried under the same conditions as for Examples 3 and 4 to obtain a composite film with no cracking.

This example demonstrates that the advantageous effects of adding the granular fluoropolymer to the dispersion is not the result of simply increasing the solids content of the casting mixture. Comparative Examples 3 and 4 have roughly the same total solids content as Example 5, yet neither Examples 3 nor 4 could be cast without cracking. Without being bound by theory, it is hypothesized that use or replacement of the smaller sized particles in the dispersion (0.2 $\mu$m median particle size) with the larger sized PTFE granules (35 $\mu$m median particles size) contributes to the advantageous properties of the casting composition and the maximum castable thickness.

Comparative Example 6

A dispersion D60A PTFE was used to coat 1080-style woven glass on a standard PTFE woven glass manufacturing line. The line was operated to pick up the maximum possible weight of PTFE solids using the standard D60A dispersion. After drying and sintering, the PTFE content of the coated glass was 40 wt. %.

Comparative Example 7

A casting composition comprising a mixture of 44 kg of D60A dispersion and 38 g of formic acid and 440 g of ASE-75 was mixed, then the pH of the mixture was increased to 8.3 with 37 g of ammonium hydroxide. The viscosity of the mixture was measured to be 1750 cp. When the mixture was used for coating 1080-style woven glass, the final PTFE content of the treated glass was increased to 80 wt. %. However, the coating was severely cracked.

Example 8

A casting composition was made by combining 18.7 kg of D60A with 1.98 kg of Teflon 7A. This mixture was thickened with ASE-75 to a viscosity of about 2000 cp. When this mixture was used for coating 1080-style woven glass, the PTFE content of the final product was 85 wt. %, and the PTFE coating was free of large cracks.

This Example demonstrates that the addition of granular fluoropolymer resin to a dispersion or solution of fluoropolymer is also effective to increase the weight percent of PTFE that can be applied to a woven glass substrate in a single pass.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A coating or casting composition, comprising
a granular first fluoropolymer resin and a dispersion second fluoropolymer resin in a first carrier liquid, wherein the granular first fluoropolymer is present in an amount of between about 5 weight % and about 60 weight % of the resin mixture on a solids basis.

2. The composition of claim 1, wherein
the granular first fluoropolymer and the dispersion second fluoropolymer are the same or different homofluoropolymer, copolymer, or terpolymer, or mixtures thereof, wherein the homofluoropolymer, copolymer, or terpolymer are derived from monomers selected from the group consisting of tetrafluoroethylene, hexafluoropropylene, perfluoroalkylvinylether, perfluoroctylvinyl ether, and ethylene.

3. The composition of claim 2, wherein
the granular first fluoropolymer and the second fluoropolymer have the same chemical composition.

4. The composition of claim 3, wherein
the granular first fluoropolymer and the dispersion second fluoropolymer are poly(tetrafluoroethylene).

5. The composition of claim 1, wherein
the composition further comprises a particulate filler.

6. The composition of claim 5, wherein
the particulate filler is at least one of glass particles, ceramic particles, metallic particles, carbon particles mineral particles, or polymeric particles selected from the group consisting of polyetherimides, polyethersulfone polymers, thermoplastic and thermoset polyimides, polyketone polymer, polyetheretherketone polymers, polyphenylenesulfide polymers, and polysulfones.

7. The composition of claim 6, wherein
the particulate filler is amorphous fused silica, glass, titania, calcium titanate, strontium titanate or barium titanate.

8. The composition of claim 1, further comprising
a viscosity modifier, a surfactant, or a combination thereof.

9. A coating or casting composition, comprising
a mixture of a granular first fluoropolymer resin and a dispersion second fluoropolymer resin in a first carrier liquid, wherein the granular first fluoropolymer is present in an amount of between about 5 weight % and about 60 weight % of the resin mixture on a solids basis; and
a particulate filler, wherein of the combined first and second fluoropolymer and particulate filler in the composition, the first and second fluoropolymer together comprise from about 5 volume % to about 85 volume % and the particulate filler comprises from about 15 volume % to about 95 volume %.

10. The composition of claim 9, wherein
the granular first fluoropolymer and the dispersion second fluoropolymer are the same or different homofluoropolymer, copolymer, or terpolymer, or mixtures thereof, wherein the homofluoropolymer, copolymer, or terpolymer are derived from monomers selected from the group consisting of tetrafluoroethylene, hexafluoropropylene, perfluoroalkylvinylether, perfluorooctylvinyl ether, and ethylene.

11. The composition of claim 9, wherein
the granular first fluoropolymer and the second fluoropolymer have the same chemical composition.

12. The composition of claim 9, wherein
the granular first fluoropolymer and the dispersion second fluoropolymer are poly(tetrafluoroethylene).

13. The composition of claim 9, wherein
the particulate filler is at least one of glass particles, ceramic particles metallic particles, carbon particles mineral particles, or polymeric particles selected from the group consisting of polyetherimides, polyethersulfone polymer, thermoplastic and thermoset polyimides, polyketone polymer, polyetheretherketone polymers, polyphenylenesulfide polymer, and polysulfones.

14. The composition of claim 9, wherein
the particulate filler is amorphous fused silica, glass, titania, calcium titanate, strontium titanate or barium titanate.

15. The composition of claim 9, wherein
the composition is a casting composition, and of the combined first and second fluoropolymer and particulate filler in the casting composition, the first and second fluoropolymer together comprise from about 30 volume % to about 70 volume % and the particulate filler comprises from about 30 volume % to about 70 volume %.

16. The composition of claim 9, wherein
the composition is a casting composition, and of the combined first and second fluoropolymer and particulate filler in the casting composition, the first and second fluoropolymer together comprises from about 35 volume % to about 60 volume % and the particulate filler comprises from about 40 volume % to about 65 volume %.

17. The composition of claim 9, further comprising
a viscosity modifier, a surfactant, or a combination thereof.

* * * * *